(12) United States Patent
Wu et al.

(10) Patent No.: US 8,155,536 B2
(45) Date of Patent: Apr. 10, 2012

(54) OPTICAL TRANSCEIVER IC

(75) Inventors: Hui-chin Wu, Cupertino, CA (US);
Miaobin Gao, Saratoga, CA (US);
Hengju Cheng, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 520 days.

(21) Appl. No.: 12/347,029

(22) Filed: Dec. 31, 2008

(65) Prior Publication Data

US 2010/0166431 A1 Jul. 1, 2010

(51) Int. Cl.
*H04B 10/06* (2006.01)
(52) U.S. Cl. .......................... 398/202; 398/197; 398/207
(58) Field of Classification Search .......... 398/135–139, 398/202
See application file for complete search history.

(56) References Cited

U.S. PATENT DOCUMENTS

| | | | |
|---|---|---|---|
| 6,597,485 B1 | 7/2003 | Ikeuchi et al. | |
| 6,657,488 B1 * | 12/2003 | King et al. | 330/9 |
| 2002/0027688 A1 | 3/2002 | Stephenson | |
| 2003/0218508 A1 | 11/2003 | Chiou et al. | |
| 2004/0136421 A1 | 7/2004 | Robinson et al. | |
| 2005/0062543 A1 * | 3/2005 | Mayampurath et al. | 330/308 |
| 2005/0200421 A1 * | 9/2005 | Bae et al. | 330/308 |
| 2006/0045531 A1 | 3/2006 | Killmeyer et al. | |
| 2007/0196112 A1 * | 8/2007 | Crews | 398/202 |
| 2008/0309407 A1 * | 12/2008 | Nakamura et al. | 330/253 |
| 2011/0026921 A1 * | 2/2011 | Ossieur et al. | 398/58 |

FOREIGN PATENT DOCUMENTS

| | | |
|---|---|---|
| WO | 2010/078159 A2 | 7/2010 |
| WO | 2010/078159 A3 | 9/2010 |

OTHER PUBLICATIONS

International Search Report and Written Opinion received for PCT Patent Application No. PCT/US2009/069241, mailed on Jul. 21, 2010, 9 pages.
International Preliminary Report on Patentability received for PCT Patent Application No. PCT/US2009/069241, mailed on Jul. 14, 2011, 6 pages.
Office Action received for European Patent Application No. 09837015.8, mailed on Aug. 12, 2011, 2 pages.

* cited by examiner

*Primary Examiner* — Dzung Tran
(74) *Attorney, Agent, or Firm* — Blakely, Sokoloff, Taylor & Zafman LLP

(57) ABSTRACT

A power management arrangement for low power optical transceiver such as those that may be integrated into a personal computer or server may periodically put itself into a power conservation or sleep mode which assures the transceiver is available upon wake-up.

14 Claims, 2 Drawing Sheets

OPTICAL TRANSCEIVER IC

FIELD OF THE INVENTION

Embodiments of the present invention are directed to low power optical transceiver integrated circuits and, more particularly, to power management for optical transceivers.

BACKGROUND INFORMATION

Optical communication networks have been implemented to enable increased data rates in links providing point to point communication. For example, optical communication links may be implemented in Synchronous Optical Network/Synchronous Digital Hierarchy (SONET/SDH) and 10 Gigabit Ethernet systems. At a receiving end of such an optical communication link, a photodiode may generate a current in response an optical signal received from an optical transmission medium (e.g., fiber optical cabling). A transimpedance amplifier (TIA) typically converts the current generated by the photodiode into a voltage signal that is then processed. For example, the voltage signal may be processed by clock and data recovery circuitry to recover data transmitted in the optical signal.

As shown for example in FIG. 1, a typical optical transceiver integrated circuit (IC) may use an analog approach to determine the input decision level. Light 100 strikes a light sensitive device, such as a photodiode 102 to produce an input current signal 104 to a TIA 106. The TIA 106 may convert the current signal 104 to an output voltage signal 108. The output voltage signal 108 may be fed back through a simple RC filter circuit comprising resistor 110 and capacitor 112 to derive an average level of an input data stream 104 which can be served as the decision level 114 for the TIA 106. This approach works as long as a continuous stream of 8/10B encoded DC-balanced data is applied to the input 104. 8/10B refers to a line code that maps 8-bit symbols to 10-bit symbols to achieve DC-balance.

However, in a PC/Server like environment, power management is very important from the system perspective. In order to save power, the optical transceiver IC needs to get into certain sleep states while there is no input signal 104. That is, the input is not a continuous stream at all time anymore, and problems are raised for the typical analog approach.

While using the RC filter circuitry, the decision level 114 droops over time due to the leakage current through the capacitor 112 (~up to few μs range). The change of the decision level 114 may lead to significant errors depending on the capacitor value 112.

However, the decision level 114 needs to be correct as soon as the transceiver recovers from a sleep state (which can be from few μs to several seconds) in order to function properly. Thus, in a PC/Server environment where power management may be an issue a different approach would be desirable.

BRIEF DESCRIPTION OF THE DRAWINGS

The foregoing and a better understanding of the present invention may become apparent from the following detailed description of arrangements and example embodiments and the claims when read in connection with the accompanying drawings, all forming a part of the disclosure of this invention. While the foregoing and following written and illustrated disclosure focuses on disclosing arrangements and example embodiments of the invention, it should be clearly understood that the same is by way of illustration and example only and the invention is not limited thereto.

DETAILED DESCRIPTION

Described is power management arrangement for low power optical transceiver such as those that may be integrated into a personal computer or server that periodically puts itself into a power conservation or sleep mode which assures the transceiver is available upon wake-up.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

A photodiode as referred to herein relates to a device that provides an output current in response to light energy collected on a surface. For example, a photodiode may provide an output current in response to charge collected at a photodiode gate. However, this is merely an example of a photodiode and embodiments of the present invention are not limited in this respect.

An amplifier as referred to herein relates to a device or circuit to convert an input signal to an amplified output signal. For example, an amplifier may provide an amplified output signal having a magnitude that is related to a magnitude of an input signal by an amplification gain. In another example, an amplifier may generate a voltage signal having a magnitude related by an amplification gain to a magnitude of either a current or voltage received as an input signal. However, these are merely examples of an amplifier and embodiments of the present invention are not limited in these respects.

A transimpedance amplifier (TIA) as referred to herein relates to a device to convert an input current to an output voltage. For example, a TIA may convert an input current received from a photodiode to an output voltage that is substantially proportional to a magnitude of the input current. However, this is merely an example of a TIA and embodiments of the present invention are not limited in these respects.

As noted above, in the more common analog approach, the decision level used by the TIA to determine the output level of the photodiode relies on a steady input signal which typically is not available in sleep mode. This change of the decision level may lead to significant errors at wake-up.

Figure 1:
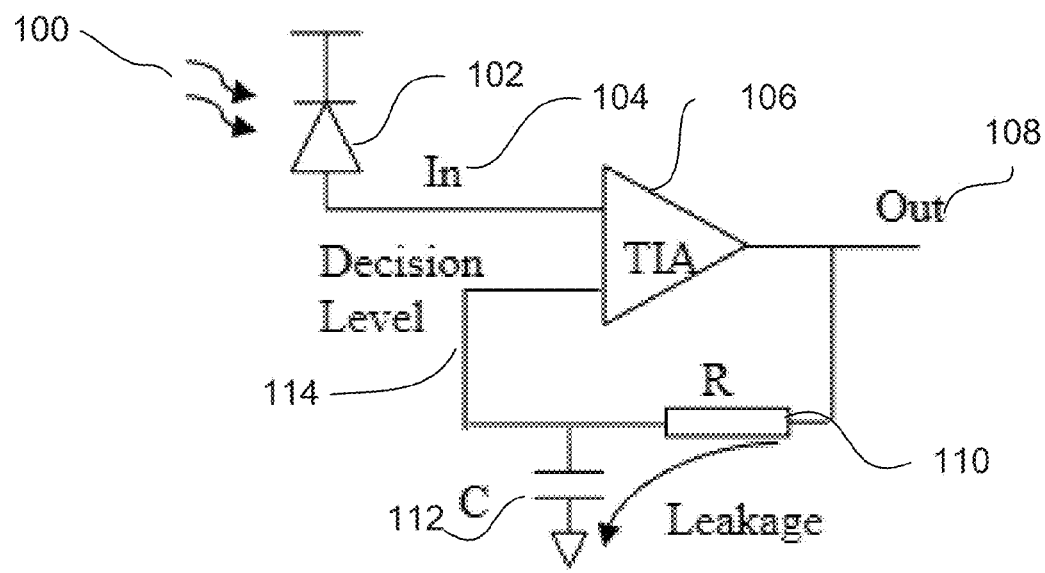
FIG. 1 is a circuit diagram for determining the decision levels for an optical transceiver.
Figure 2:
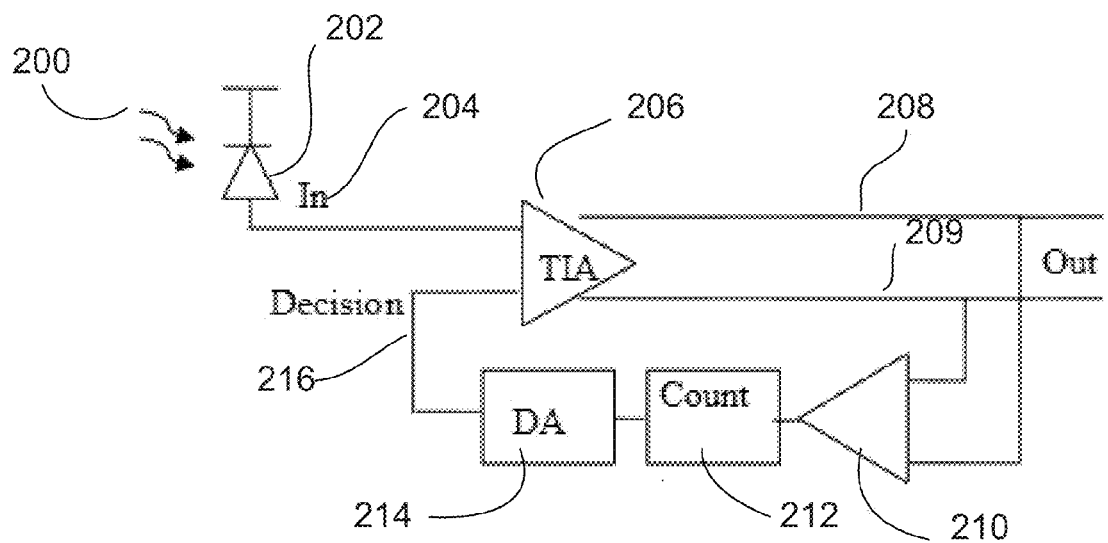
FIG. 2 is a circuit diagram for determining the decision levels for an optical transceiver IC according to one embodiment of the invention.

In order to solve the above issue, a digital loop is proposed to determine the decision level for the optical transceiver. Referring to FIG. 2, there is shown a low power optical transceiver according to one embodiment of the invention. As before, light 200 strikes a light sensitive device, such as a photodiode 202 to produce an input current signal 204 to a TIA 206. Unlike before, the TIA 206 may provide differential output voltage signals 208 and 209 based on the current signal 204 from the photodiode 202. A digital feedback loop may comprise a comparator which detects changes in the differential output voltage signals 208 and 209. The output of the comparator 210 may be input into a counter 212 which may change states depending on the light input signal 204. The digital output of the counter is fed to a digital to analog converter (DAC) 214. The DAC outputs a current according to the difference output from the comparator 210.

Since these are digital circuits, even in the sleep modes they remain at the same states. Thus, the decision level 216 may be held infinitely regardless the appearance of the input signal 204. Moreover, the loop time constant is determined by the counter clock 212 and can be adjusted dynamically to ensure the loop stability.

Figure 3:
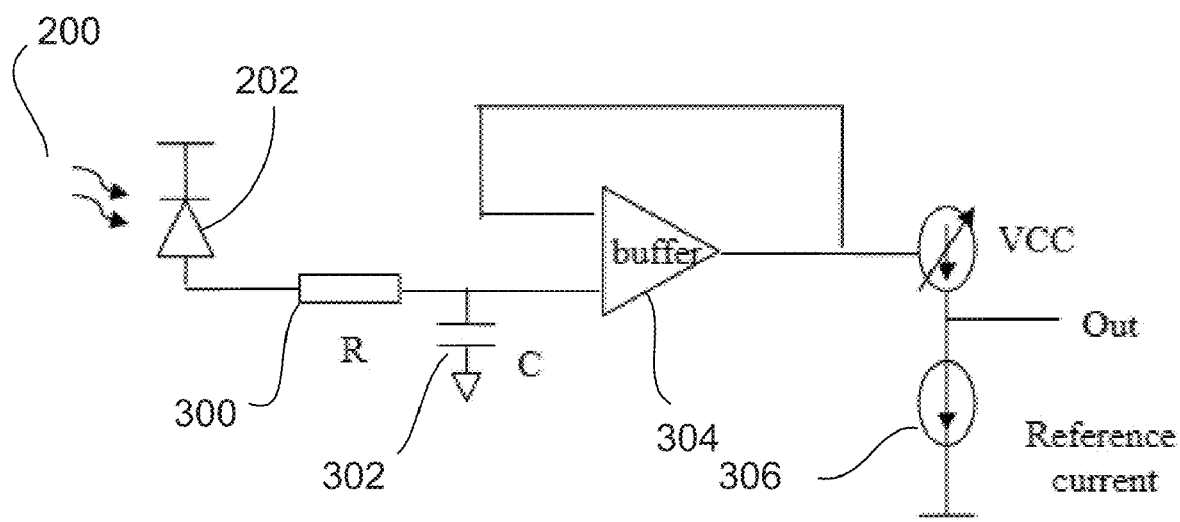
FIG. 3 is a circuit diagram for a signal detect circuit for an optical transceiver IC.

FIG. 3 is a circuit diagram for a signal detect circuit for an optical transceiver IC. This circuit may work in conjunction with the decision level circuit of FIG. 2 to achieve a improved power management. As shown, a light signal 200 may impinge on a light sensitive device, such as a photodiode 202 which converts it to an electrical signal. This electrical signal passes through a low pass filter comprising resistor 300 and a capacitor 302 and into a buffer 304. According to embodiments, this circuit monitors an input signal and compares it to a reference current 306 to adjust its output. Then the signal detect circuit output goes to a logic circuit to determine if a power saving mode should be entered into by the transceiver IC. In other words, the signal detect circuit allows all the power-hungry circuit blocks be turned off or in sleep states for lower power consumption over time if no light signal 200 is present.

The above described embodiments may be advantageous, in many applications, for example in the optical universal serial bus (Optical USB or Converge I/O) standard. Since power management is a priority to PC/Server platforms, this invention is able to better handle the power requirements.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. An apparatus, comprising:
a light sensitive device to convert a light signal to an electrical signal, the light sensitive device coupled with a power conservation circuit, wherein the power conservation circuit comprises:
a buffer to compare the output of the light sensitive device with a reference current, and
a variable output voltage controlled by the buffer;
an amplifier to amplify the electrical signal to produce a differential output;
a comparator to monitor the difference between the average of the differential output;
a counter to count up and down according to an output of the comparator; and
a digital to analog converter to convert the digital output of the counter into analog signal and is fed back to the amplifier to adjust a decision level.

2. The apparatus as recited in claim 1 wherein the decision level signal is held regardless of an appearance of the light input signal.

3. The apparatus as recited in claim 1 wherein the amplifier comprises a transimpedance amplifier.

4. The apparatus as recited in claim 1 wherein the light sensitive device comprises a photodiode.

5. The apparatus as recited in claim 1, further comprising: a low pass filter between the light sensitive device and the buffer.

6. A method, comprising:
detecting an input light signal;
converting the light signal to an electrical signal;
amplifying the electrical signal according to a decision level signal, the amplifier producing a differential output;
comparing differential output with a comparator; producing a counter signal from the output of the comparator;
converting a digital counter signal to an analog output to produce the decision level signal;
entering a power saving mode if no light input signal is detected;
comparing the electrical signal with a reference current; and
varying a supply voltage according to the comparison to enter a power saving mode.

7. The method as recited in claim 6 further comprising:
converting the light signal to an electrical signal with a photodiode.

8. The method as recited in claim 6 further comprising:
amplifying the electrical signal with a transimpedance amplifier.

9. The method as recited in claim 6 further comprising:
holding the decision level signal regardless of an appearance of the input light signal.

10. The method as recited in claim 6, further comprising:
passing the electrical signal through a low pass filter prior to comparing.

11. An optical transceiver system, comprising:
a decision level detect circuit, comprising: a light sensitive device to convert a light signal to an electrical signal;
an amplifier to compare the electrical signal to a decision level signal, the amplifier producing a differential output;
a comparator to receive the differential output;
a counter to receive an output of the comparator; and
a digital to analog converter to convert the output of the counter into the decision level signal; and
a power saving circuit to put the decision level circuit in a power saving mode when a light signal is not present, wherein the power saving circuit further comprises a variable voltage source to supply a voltage to the decision level detect circuit 12. The system as recited in claim 11, wherein the decision level signal is held regardless of an appearance of the light input signal.

13. The system as recited in claim 12, further comprising:
a reference current to compare with the electrical signal.

14. The system as recited in claim 11 wherein the optical transceiver system comprises part of an optical universal serial bus (optical USB).

* * * * *